United States Patent [19]

Ellingen et al.

[11] Patent Number: 4,942,356
[45] Date of Patent: Jul. 17, 1990

[54] MODULAR ELECTRONIC DEVICE

[75] Inventors: David R. Ellingen, Kenosha; Steven E. Michalski, Franklin; Daniel Mieczkowski; Larry D. Pacetti, both of Kenosha, all of Wis.

[73] Assignee: Snap-on Tools Corporation, Kenosha, Wis.

[21] Appl. No.: 372,228

[22] Filed: Jun. 26, 1989

Related U.S. Application Data

[63] Continuation of Ser. No. 189,477, May 12, 1988, abandoned.

[51] Int. Cl.⁵ ................................................ G01R 1/04
[52] U.S. Cl. ...................................... 324/156; 361/392
[58] Field of Search .................... 324/156, 157, 115; 361/392, 393, 394, 415; 439/357, 358, 361, 362

[56] References Cited

U.S. PATENT DOCUMENTS

| 3,559,813 | 2/1971 | Sosinski | 439/357 |
|---|---|---|---|
| 3,594,689 | 7/1971 | Rottweil | 361/393 |
| 3,619,776 | 11/1971 | Kinninger | 324/115 |
| 3,737,767 | 6/1973 | Slutsky | 324/504 |
| 3,757,218 | 9/1973 | Oliverio et al. | 324/156 |
| 3,993,390 | 11/1976 | Eigenbrode | 439/358 |
| 4,009,477 | 2/1977 | Rozylowicz | 324/156 |
| 4,115,733 | 9/1978 | Silberberg | 324/99 D |
| 4,153,127 | 5/1979 | Klink et al. | 361/392 |
| 4,216,522 | 8/1980 | Slagel et al. | 361/392 |
| 4,254,375 | 3/1981 | Matsuoka | 324/115 |
| 4,439,726 | 3/1984 | Hochreuther et al. | 324/156 |
| 4,570,117 | 2/1986 | Holt | 324/72 |
| 4,608,532 | 8/1986 | Ibar et al. | 324/73 R |
| 4,742,478 | 5/1988 | Nigro, Jr. et al. | 361/394 |
| 4,870,863 | 10/1989 | Duncan et al. | 361/394 |

FOREIGN PATENT DOCUMENTS

| 87788 | 9/1983 | European Pat. Off. | 361/392 |
|---|---|---|---|
| 2140355 | 11/1984 | United Kingdom | 361/394 |

*Primary Examiner*—Reinhard J. Eisenzopf
*Assistant Examiner*—Maura K. Regan
*Attorney, Agent, or Firm*—Emrich & Dithmar

[57] ABSTRACT

The modular electronic device includes a main unit and at least one plug-in module adapted to be removably slid on to and mounted on the main unit. There are first and second interfitting connectors respectively on the main unit and the module which automatically interfit when the module is mounted. First and second interfitting track structure are respectively on the module and main unit to facilitate sliding the module onto the main unit. Finally, there is first and second interfitting latching elements respectively on the main unit and the module to hold the module latched in place.

23 Claims, 2 Drawing Sheets

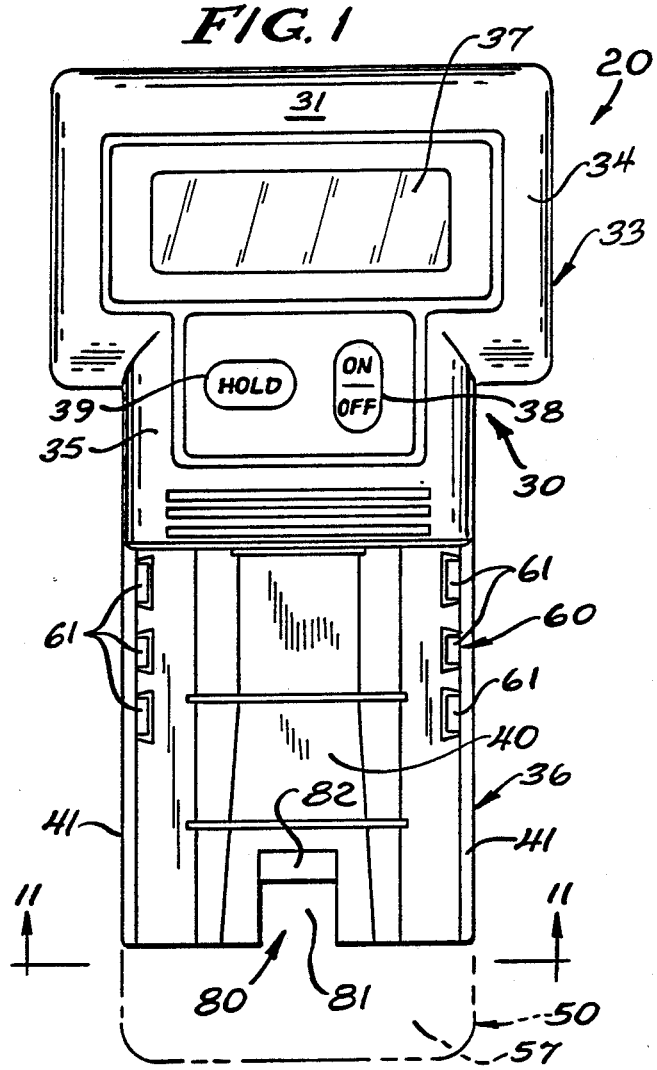
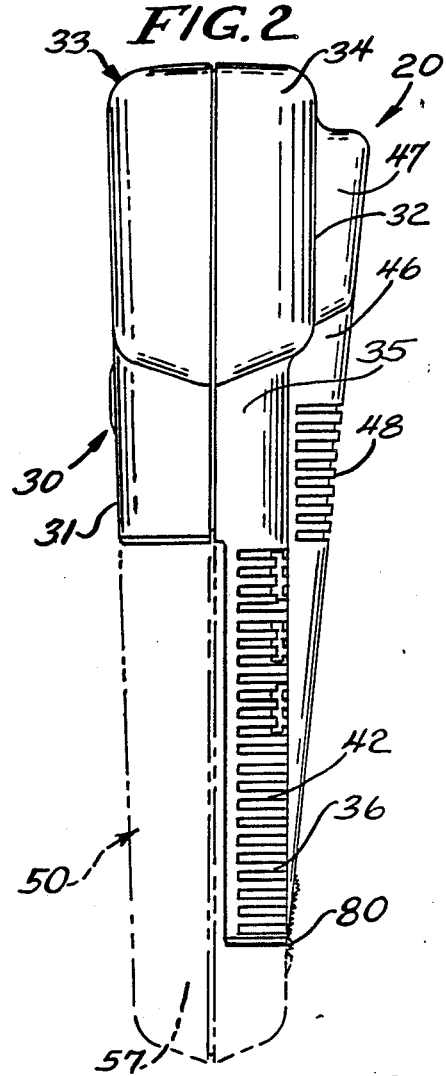
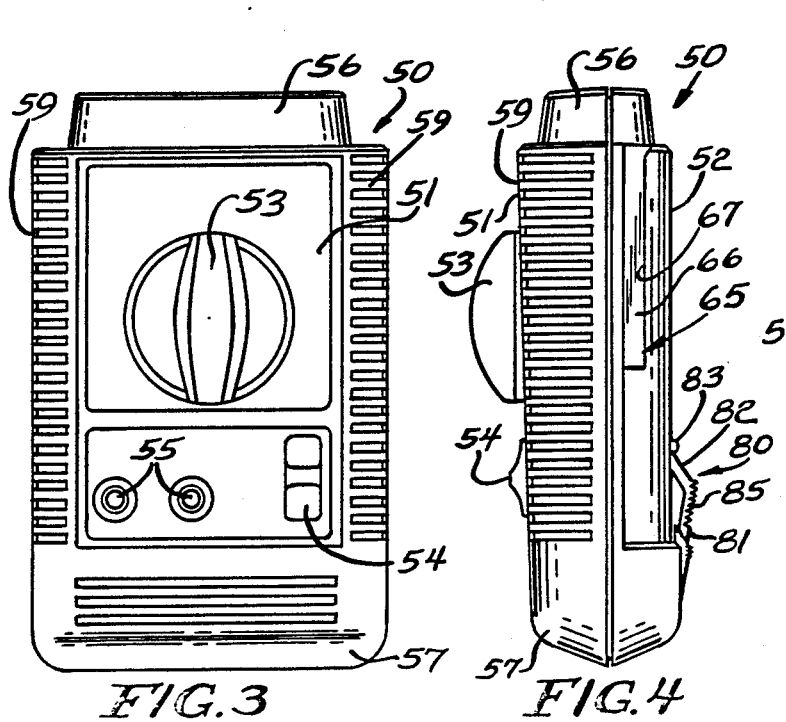
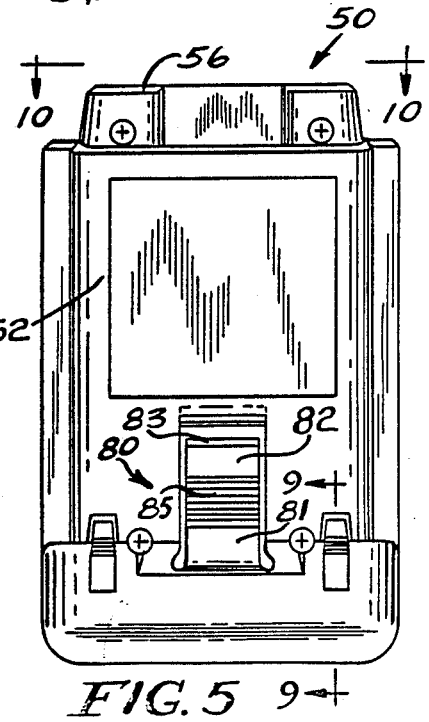

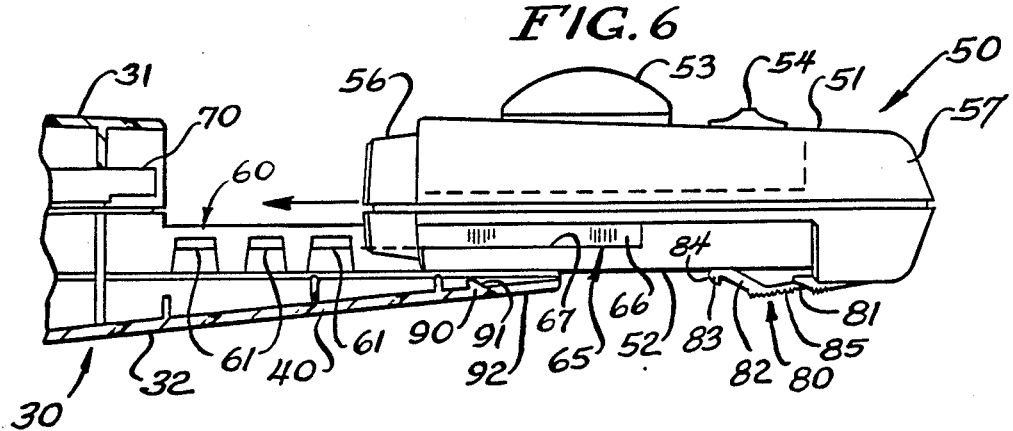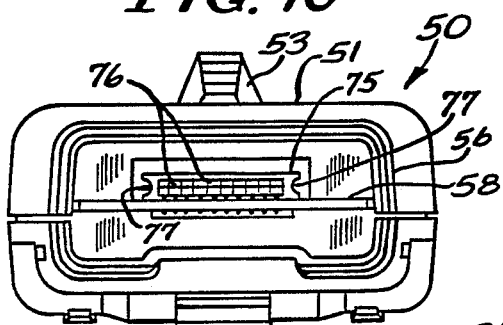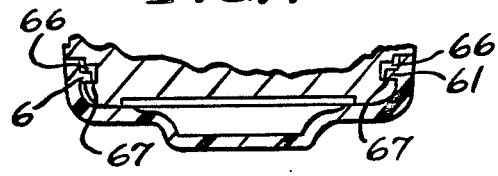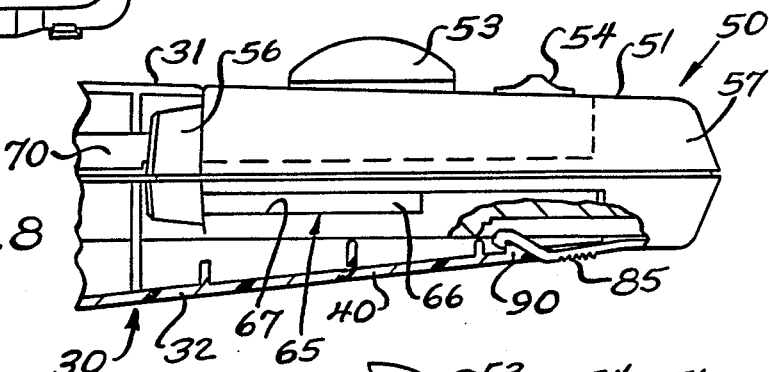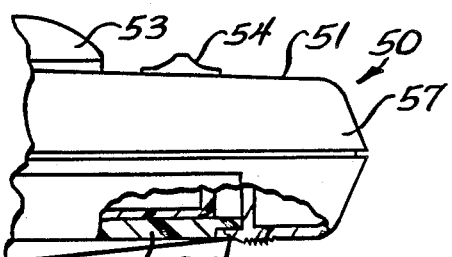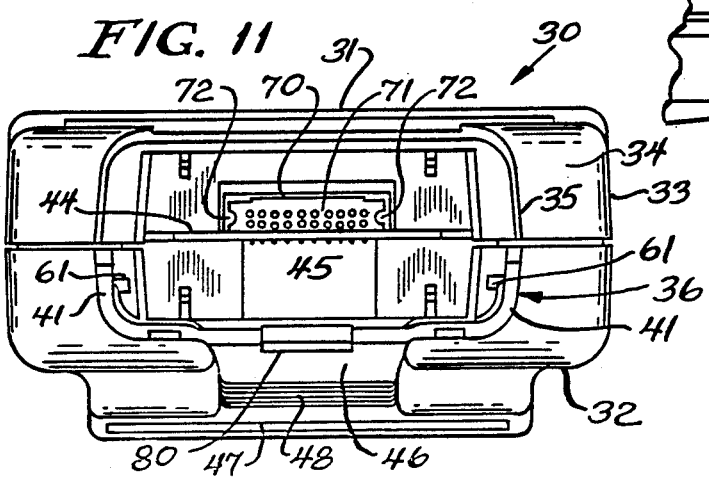

MODULAR ELECTRONIC DEVICE

This is a continuation of application Ser. No. 189,477, filed May 2, 1988, now abandoned.

BACKGROUND OF THE INVENTION

Most meters have a limited usefulness. A volt/ohm meter is used to determine voltage and resistance, for example. In conducting an analysis of a vehicular engine, it is common to analyze a number of different parameters. Currently, the mechanic has to have a collection of different meters to perform the various analyses required from time to time. Thus, he may need a volt/ohm meter, a primary tach/dwell meter, a secondary tach meter, a DC current meter and a pressure meter. This is expensive because the mechanic has to purchase the entirety of a number of different meters. But, there is much circuitry in common among the various meters. For example, the display, circuitry to drive the display, a microprocessor, a power supply and certain switching structure are much the same in various meters.

SUMMARY OF THE INVENTION

It is, therefore, an important object of the present invention to provide a modular electronic device comprising a main unit and one or more modules which can be plugged into the main unit so that it can be several devices in one.

Another object is to provide such a device in which the modules are readily engaged with and removed from the main unit.

Another object is to provide an improved latching structure to ensure that the module is firmly held in place on the main unit, yet is readily removed when replacement is desired.

Another object is to enable use of such a device in an environment in which the electrical interconnection between the main unit and the modules are shrouded to minimize the entry of dirt and grease which the mechanic often encounters.

In summary, there is provided a modular electronic device comprising a main unit, at least one plug-in module adapted to be removably slid on to and mounted on the main unit, first and second interfitting electrical connectors respectively on the main unit and the module and automatically interfitting when the module is mounted on the main unit, and first and second interfitting track structures respectively on the main unit and the module for guiding the module on to and off of the main unit.

In another aspect of the invention, the modular electronic device also comprises first and second interfitting latch elements respectively on the main unit and the module and having a latching condition and an unlatching condition.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention,, its construction and operation, and many of its advantages should be readily understood and appreciated.

FIG. 1 is a plan view of a modular electronic meter incorporating the features of the present invention, the module thereof being depicted in phantom;

FIG. 2 is a side elevation view of the modular electronic meter of FIG. 1;

FIG. 3 is a plan view of the module of the meter;

FIG. 4 is a side elevational view of the module;

FIG. 5 is a rear plan view of the module;

FIG. 6 is a fragmentary view of the meter, in partly assembled condition, in which the main unit is sectioned and the module is in side elevation;

FIG. 7 is a view in section showing the relationship of the parts of/the track structure;

FIG. 8 is a view like FIG. 6, but with the module assembled to the main unit;

FIG. 9 is a fragmentary view in section taken along the line 9—9 of FIG. 5;

FIG. 10 is an end elevation view of the module taken along line 10—10 of FIG. 5; and FIG. 11 is an end elevation view of the main unit taken along the line 11—11 of FIG. 1.

DESCRIPTION OF A PREFERRED EMBODIMENT

Turning now to the drawings, and more particularly to FIGS. 1 and 2 thereof, there is depicted a modular electronic device which in the embodiment shown is a modular meter 20, although other kinds of electronic devices can be designed to employ the features of this invention. The meter 20 includes two basic components: a main unit 30 and one or more modules 50. All that is depicted in the drawings is a module 50 that enables the meter 20 to be what is commonly called a "volt/ohm meter", that is, to detect voltage and resistance.

The main unit 30 is defined by a housing in which is mounted various electrical and mechanical components. Few of the electrical components are visible, but they would commonly include an LCD display, circuitry to drive the display, a microprocessor, and a power supply which converts a battery voltage to a voltage usable by the circuitry both in the main unit and the module. None of these components are visible in the drawings. The housing is in two main parts which are held together by screws or the like. The parting line of the two parts is visible in FIG. 2.

The main unit 30 has a front face 31 and a rear face 32. In the embodiment shown, the main unit is elongated and is generally T-shaped in plan as can be seen in FIG. 1. Thus, the main unit 30 has a head portion 33 which has a wide section 34 at one end and a narrow section 35. Extending from the narrow section 35, at approximately the same width, is a foot portion 36.

In the front face 31, extending across the wide section 34 is a window 37 through which a digital LCD display, for example, is visible. Located on the narrow section 35 is a main on/off switch 38 for the unit as well as a hold switch 39. Actuation of the latter switch would cause the digital display to remain irrespective of changes in the engine parameters. The switches 38 and 39 preferably are of the membrane type and project slightly above the front face 31. The window 37 is flush with the front face 31.

Whereas the front face 31 is only in the area of the head portion 33, the rear face 32 extends along the entirety of the main unit 30 and is the outer surface of a rear wall 40. Extending forwardly from the rear wall 40 in the region of the foot portion 36 is a pair of side walls 41. The side walls have a depth approximately half the depth of the head portion 33, whereby the main unit 30 may be said to have a generally L shape in elevation. The rear face 32 has ribs 42 in the region of the side walls 41 to facilitate gripping of the meter 20.

As may be best seen in FIG. 11, a PC board 44 is located in the main unit 30 in the head portion 33 thereof. The PC board 44 is generally parallel to the front face 31 and the rear face 32 and is located midway between. The circuit components, which form a part of the main unit 30, are mounted on the PC board, but are not shown. The space beneath the PC board 44 defines a battery compartment 45. It is in this compartment where the battery is inserted. It is electrically coupled to the components mounted on the circuit board.

The main unit 30 includes a stand 46 (FIG. 2) which protrudes rearwardly from the rear face 32 and has increasingly greater depth from the foot portion toward the head portion. Thus, when the main unit 30 is resting on a support surface, the head portion 33 will be elevated, thereby making it easier to read the digital display. The stand 46 is an integral part of the housing of the main unit 30 and is hollow. Actually, much of the battery compartment 45 is located within the hollow interior of the stand 46. The stand also rigidifies and strengthens the housing of the main unit 30. The outer surface of the central portion of the stand 46 has ribs 48 to facilitate holding of the main unit 30.

Referring to FIGS. 3-5, the meter 20 comprises a module 50 (FIG. 2) which is also elongated in this particular embodiment. It has a front face 51 and a rear face 52. On the front face 51 is mounted a rotary switch 53 and a slide switch 54. A pair of jacks 55 accommodate connection of probes. One end of the module 50 has a nose 56 protruding therefrom. The module 50 has a portion 57 at the other end. As is best seen in FIG. 10, the module 50 includes a PC board 58 parallel to the front face 51 and the rear face 52 and generally midway between. The electrical circuitry associated with the module 50 is mounted on the PC board. The sides of the front face 51 and the side surfaces have ribs 59 to facilitate holding of the meter 20.

The meter 20 comprises track structure 60 (FIG. 1) on the main unit 20 in the form of three inwardly extending, longitudinally spaced-apart bosses 61 on each of the side walls 41. Track structure 65 (FIG. 4) is provided on the module 50, in the form of a groove 66 on each side of the module, extending from the end near the nose 56 toward the end portion 57. The length of each groove 66 is about half the length of the module 50. The rear surface of each groove 66 defines a shoulder 67.

Referring to FIG. 6, the meter 20 is assembled by holding the main unit 30 in one hand and using the other hand to place the module 50 on the foot portion 36 near its free end. In this condition, the bosses 61 will be aligned with the grooves 66. The module 50 is slid in the direction of the arrow in FIG. 6 so that the bosses 61 enter the grooves 66. The module is slid to the left and into place, as shown in FIG. 8. The bosses 61 engage the shoulders 67 as depicted in FIG. 7. The portion 57 of the module 50 protrudes beyond the main unit 30, as can be seen in FIG. 2, and defines the end of the meter 20.

Referring to FIG. 11, the main unit 30 includes a connector 70 mounted on top of its printed PC board 44. The connector 70 has a multiplicity of pins 71 that are electrically connected to the circuit components on that board. As can be best seen in FIG. 6, the outermost end of the connector 70 is recessed in the end of the head portion 33. As a result, dirt and grease are less likely to foul the connector. The sides of the connector 70 respectively have inwardly directed tongues 72 (FIG. 11).

Referring to FIG. 10, the module 50 includes a connector 75 mounted on the PC board 58 and having a multiplicity of receptacles 76 electrically connected to circuit components on the PC board. The sides of the connector 75 respectively have outwardly directed grooves 77. As can be seen in FIG. 6, the connector 75 is recessed within the module 50. Specifically, the outer end of the connector 75 is recessed from the outer end of the nose 56. Thus, the connector 75 is also protected somewhat against entry of dirt and grease.

The connectors 70 and 75 are adapted to mate with each other as the module 50 slides onto the main unit 30, with the pins 71 entering the receptacles 76. The inwardly directed tongues 72 on the connector 70 interfit with the grooves 77 on the connector 75, to facilitate guiding the connectors into mating relationship.

The receptacles 76, making connection to the pins 71, electrically interconnect the electrical parts of the module 50 with the electrical parts of the main unit 30.

The module 50 is provided with a latch element 80 similar to a leaf spring, which element is integral with the housing of the module and is located in the region of the end portion 57. The latch element 80 protrudes rearwardly from the rear face 52. It consists of an arm 81 cantilevered to the housing of the module, the outer end of the arm 81 carrying a finger 82 which angles slightly forwardly. Its outer end or tip 83 has a camming surface 84 (FIG. 8). The arm 81 has a serration to facilitate engagement by one's thumb. On either side of the latching element 80 is a projection 87 (FIG. 9) which is spaced from the rear face 52.

The main unit 30 has a cut out 92 (FIG. 6) the width of which is slightly greater than that of the latch element 80. In the cut out 92 is latch structure in the form of a keeper boss 90 on the rear wall 40, the boss 90 having a camming surface 91.

Referring again to FIG. 6, when the module 50 is slid onto the main unit 30, the latch element 80 enters the cut out 92, and the camming surface 84 strikes the boss 90. Further movement in the direction of the arrow causes the latch element 80 to deflect toward the front face 51. The tip 83 rides up the camming surface 91 until the tip 84 clears the boss 90 whereupon it snaps into the latching position shown in FIG. 8. The module 50 is thereupon latched into place on the main unit 30. As can be seen in FIG. 9, the rear wall 40 at the free end thereof fits into the space defined between the projections 87 and the rear face 52. Then the meter 30 functions as a unitary device.

When it is desired to replace the module 50 with another module performing another purpose or to repair the module 50, the user grasps the main unit 30 in one hand and uses a finger on his other hand to depress the latch element 80. The tip 83 clears the boss 90 whereupon the module 50 can be withdrawn opposite to the direction of the arrow depicted in FIG. 6.

What has been described therefor is an improved modular electronic device such as a meter, the modules of which can be readily changed. Track structure enables the module to be slid on to and removed from the main unit. Latching structure holds the module in position so that it has the feel and performance of a unitary meter. Mounted in the main unit would be all the elements common to a number of electronic devices. Mounted in each module would be only those elements corresponding to each particular electronic device. For example, the main unit would include the display, circuitry to drive the display, a microprocessor, a power supply and certain switching structure, and each module would have switching structure and certain circuitry.

We claim:

1. A modular electronic device comprising a main unit, at least one plug-in module adapted to be removably slid on to and mounted on said main unit, first and second interfitting electrical connectors respectively on said main unit and said module and automatically interfitting when said module is mounted on said main unit, said main unit being open at one end thereof such that said module is slid through said one end in a longitudinal direction, and first and second interfitting track structure respectively on said main unit and said module for guiding said module on and off of said main unit, said first and second interfitting track structure being constructed and arranged to prevent said module from being moved in a direction transverse to said longitudinal direction, said interfitting track structure including a groove.

2. The modular electronic device of claim 1, wherein said main unit and said module are elongated.

3. The modular electronic device of claim 1, wherein said main unit is generally L-shaped in elevation and has a head portion and a foot portion, said foot portion being shallower than said head portion.

4. The modular electronic device of claim 3, wherein said head portion and said foot portion are generally the same length.

5. The modular electronic device of claim 3, wherein said main unit includes display means and switch means on said head portion.

6. The modular electronic device of claim 3, wherein said foot portion has a rear wall and a pair of side walls, said module having a portion of substantial length that resides between said walls, and a portion of substantially lesser length extending beyond said open end of said main unit.

7. The modular electronic device of claim 6, wherein said first track structure is on the interior of said side walls, said second track structure being on said module.

8. The modular electronic device of claim 1, wherein said main unit includes display means and switch means.

9. The modular electronic device of claim 1, and further comprising first switch means and display means on said main unit, second switch means on said module, and inputs on said module.

10. The modular electronic device of claim 1, wherein said module has a portion of substantial length that does not extend beyond the end of said main unit, and an end portion of substantially lesser length extending beyond the end of said main unit.

11. The modular electronic device of claim 1, wherein said main unit has a compartment for a battery.

12. The modular electronic device of claim 1, and further comprising a printed circuit board mounted in the main unit generally parallel to the direction of movement of said module, said first connector being mounted on one side of said printed circuit board and further comprising a battery compartment on the other side thereof.

13. The modular electronic device of claim 1, wherein said main unit has a rear face and a front face, said main unit further having a wedge-shaped stand which protrudes from said rear face and is integral therewith, whereby when said device is placed on a support surface, one end thereof is continually elevated with respect to the other end.

14. The modular electronic device of claim 13, wherein said stand is hollow, defining a compartment for a battery.

15. The modular electronic device of claim 1, wherein the main unit and the module are ribbed to facilitate holding of the electronic device.

16. The modular electronic device of claim 1, wherein said module includes a nose protruding therefrom, said second connector being in said nose.

17. The modular electronic device of claim 1, and further comprising guide structure on said connectors to guide said connectors into place.

18. A modular electronic device comprising a main unit, at least one plug-in module adapted to be removably slid on to and mounted on said main unit, first and second interfitting electrical connectors respectively on said main unit and said module and automatically interfitting when said module is mounted on said main unit, said main unit being open at one end thereof for receiving said module through said one end in a given direction, and first and second interfitting track structure respectively on said main unit and said module for guiding said module on to and off of said main unit, said first and second interfitting track structure being constructed and arranged to prevent said module from being moved transversely to said given direction, said main unit being T shaped in plan and having a head portion and a foot portion, said head portion having a wide section and a narrow section, said foot portion having a width substantially matching the width of said narrow section and being a continuation thereof.

19. The modular electronic device of claim 18, wherein said first connector is in said narrow section.

20. The modular electronic device of claim 18, and further comprising display means in said wide section and switch means in said narrow section.

21. A modular electronic device comprising a main unit, at least one plug-in module adapted to be removably slid on to and mounted on said main unit, first and second interfitting electrical connectors respectively on said main unit and said module and automatically interfitting when said module is mounted on said main unit, said main unit being open at one end thereof such that said module is slid through said one end in a longitudinal direction, first and second interfitting track structure respectively on said main unit and said module for guiding said module on to and off said main unit, said first and second interfitting track structure being constructed and arranged to prevent said module from being moved in a direction transverse to said longitudinal direction, and first and second interfitting latch elements respectively on said main unit and said module and having a latching condition and an unlatching condition, said interfitting track structure including a groove.

22. The modular electronic device of claim 21, wherein said first latching element is fixed and said second latching element is movable between the latching and unlatching condition, said second latching element being biased to the latching condition, said second latching element having a camming surface adapted to be engaged by the main unit as said module is slid on to said main unit, said second latching element snapping to the latching condition upon passing said first latching element.

23. The modular electronic device of claim 22, wherein said second latching element has finger engaging means to be used to move said second latching element to the unlatching condition to enable withdrawal of said module from said main unit.

* * * * *

UNITED STATES PATENT AND TRADEMARK OFFICE
CERTIFICATE OF CORRECTION

PATENT NO. : 4,942,356
DATED : July 17, 1990
INVENTOR(S) : David R. Ellingen, et al.

It is certified that error appears in the above-identified patent and that said Letters Patent is hereby corrected as shown below:

On the title page:

[56] Other Prior Art --

-- AEMC 1984 Catalog, Testing and Measuring Instruments for the Professional, 3 pages --

Signed and Sealed this

Eighth Day of October, 1991

Attest:

HARRY F. MANBECK, JR.

*Attesting Officer*   *Commissioner of Patents and Trademarks*